United States Patent
Chang (10) Patent No.: US 10,630,423 B2
(45) Date of Patent: *Apr. 21, 2020

(54) TWO BIT ERROR CALIBRATION DEVICE FOR 128 BIT TRANSFER AND THE METHOD FOR PERFORMING THE SAME

(71) Applicant: Chin Pen Chang, New Taipei Hsien (TW)

(72) Inventor: Chin Pen Chang, New Taipei Hsien (TW)

( * ) Notice: Subject to any disclaimer, the term of this patent is extended or adjusted under 35 U.S.C. 154(b) by 117 days.

This patent is subject to a terminal disclaimer.

(21) Appl. No.: 15/873,908

(22) Filed: Jan. 18, 2018

(65) Prior Publication Data
US 2019/0222353 A1    Jul. 18, 2019

(51) Int. Cl.
*H04L 1/00* (2006.01)
*G06F 11/10* (2006.01)
*H03M 13/09* (2006.01)

(52) U.S. Cl.
CPC ........ *H04L 1/0061* (2013.01); *G06F 11/1004* (2013.01); *G06F 11/1048* (2013.01); *H03M 13/096* (2013.01); *H04L 1/0078* (2013.01)

(58) Field of Classification Search
None
See application file for complete search history.

(56) References Cited

U.S. PATENT DOCUMENTS 8,185,802 B2 *   5/2012   Noguchi ............ G06F 11/1068
                                                       365/185.09
8,482,223 B2 *   7/2013   Draper ............... H05B 37/0218
                                                       315/307
9,811,416 B2 *  11/2017   Gao .................... G06F 11/1068

* cited by examiner

*Primary Examiner* — Phung M Chung (57) ABSTRACT

A method for determining two bits errors in transmission of 128 bits and the device for realization of this method is provided. By the method and device, the two error bits transferred bits can be determined and corrected by using least bits in operation. Therefore, the amount of data in transmission is increased with a least quantity and thus the transmission quality is not affected.

15 Claims, 11 Drawing Sheets

Operator 70 dividing the 128 bits of bit into 32 data bit sets 50 with each set having 4 bits; and deriving the calibration bits cb0 to cb15. The dividing data being stored into the memories 20 and the calibration chips 30 (step 200);

↓

Transferring the data in the memories 20 and the calibration chips 30 to the data bus 40 which receives these data from the 64 receiving ports 41 thereof (step 210);

↓

A receiving end 60 receiving the data from the data bus 40 (step 220).

↓

Based on the receiving 128 bit data in the receiving end and originally stored in the memories 20, The comparator 80 calculating the checksum and bit sums as defined above (step 230);

↓

If there are two bits error in the received 128 bit as comparing from the bits stored in the memories 20, the checksums and bit sums calculated from by the comparator 80 and transferred from the calibration chips 30 will exist differences. Furthermore, from the table shown in Figs. 7 to 11, the data set 50 and the positions having the bit error are got. Then changing the bit from 0 to 1, or from 1 to 0 will correct the bit error (step 240).

↓

After correction, a new set of 128 bits is derived, the comparator 80 calculates the calibration bits cb0 to cb15 as described above for the corrected new 128 bits. If all the calibration bits are identical, it means that the corrections are correct. If some calibration bits are different, it means that the numbers of the error bits in transfer are greater than 2 (step 250).

Fig. 4

| cb0 | cb1 | cb2 | cb3 | cb4 | cb5 | cb6 | cb7 | cb8 | cb9 | cb10 | cb11 | 1st error bit | 2nd error bit |
|---|---|---|---|---|---|---|---|---|---|---|---|---|---|
| X |   |   |   |   |   |   |   |   |   |   |   | 0th bit of 0th data set | 1st bit of 0th data set |
|   | X |   |   |   |   |   |   |   |   |   |   | 0th bit of 0th data set | 2nd bit of 0th data set |
| X | X |   |   | X |   |   |   |   |   |   |   | 0th bit of 0th data set | 3rd bit of 0th data set |
| X |   | X |   | X |   |   |   |   |   |   |   | 0th bit of 0th data set | 1st bit of 1st data set |
|   | X | X |   | X |   |   |   | X | X |   |   | Determine by other bits | Determine by other bits |
| X | X | X |   | X |   |   |   | X | X |   |   | 0th bit of 0th data set | 3rd bit of 1st data set |
|   | X |   | X | X |   |   |   | X |   | X |   | Determine by other bits | Determine by other bits |
| X | X |   | X | X |   |   |   | X |   | X |   | Determine by other bits | Determine by other bits |
| X | X | X | X | X |   |   |   | X | X |   |   | 0th bit of 0th data set | 3rd bit of 3rd data set |
| X |   | X | X | X |   |   |   | X |   |   |   | 0th bit of 0th data set | 0th bit of 1st data set |
|   |   |   | X | X |   |   |   | X |   | X |   | 0th bit of 0th data set | 0th bit of 2nd data set |
| X |   | X | X | X |   |   |   | X |   | X | X | Determine by other bits | Determine by other bits |
|   | X | X | X | X |   |   |   | X |   |   | X | 0th bit of 0th data set | 0th bit of 3rd data set |
| X | X | X | X |   |   |   |   | X |   |   | X | 0th bit of 0th data set | 1st bit of 3rd data set |
| X | X | X |   |   |   |   |   |   |   |   | X | 0th bit of 0th data set | 2nd bit of 3rd data set |
| X | X |   |   |   |   |   |   |   | X |   |   | 1st bit of 0th data set | 2nd bit of 0th data set |
| X |   | X |   |   |   |   |   | X | X |   |   | 1st bit of 0th data set | 3rd bit of 0th data set |
| X | X | X |   |   |   |   |   | X |   |   |   | 1st bit of 0th data set | 1st bit of 1st data set |
| X | X | X |   |   |   |   |   | X |   | X |   | 1st bit of 0th data set | 2nd bit of 1st data set |
| X |   |   | X | X |   |   |   | X |   |   |   | 1st bit of 0th data set | 2nd bit of 2nd data set |

Fig. 7

| cb0 | cb1 | cb2 | cb3 | cb4 | cb5 | cb6 | cb7 | cb8 | cb9 | cb10 | cb11 | 1st error bit | 2nd error bit |
|-----|-----|-----|-----|-----|-----|-----|-----|-----|-----|------|------|---------------|---------------|
| X | X |   |   |   |   |   |   | X |   | X |   | Determine by other bits | Determine by other bits |
| X |   | X | X |   |   |   |   | X |   |   | X | 1st bit of 0th data set | 0th bit of 3rd data set |
| X | X | X | X |   |   |   |   | X |   |   | X | Determine by other bits | Determine by other bits |
| X | X | X |   |   |   |   |   | X | X |   |   | Determine by other bits | Determine by other bits |
| X | X |   |   |   |   |   |   | X | X | X |   | 1st bit of 0th data set | 0th bit of 1st data set |
| X |   | X | X |   |   |   |   | X |   |   |   | 1st bit of 0th data set | 1st bit of 2nd data set |
| X |   | X | X |   |   |   |   | X |   |   | X | 1st bit of 0th data set | 1st bit of 3rd data set |
| X | X |   |   | X |   |   |   | X |   |   |   | 1st bit of 0th data set | 2nd bit of 3rd data set |
| X | X | X |   | X |   |   |   |   |   |   |   | 2nd bit of 0th data set | 3rd bit of 0th data set |
|   | X | X |   | X |   |   |   | X | X |   |   | 2nd bit of 0th data set | 1st bit of 1st data set |
| X | X |   |   | X |   |   |   | X | X |   |   | 2nd bit of 0th data set | 2nd bit of 1st data set |
|   | X |   | X | X |   |   |   | X |   |   |   | 2nd bit of 0th data set | 3rd bit of 1st data set |
| X |   |   | X | X |   |   |   | X |   | X |   | 2nd bit of 0th data set | 2nd bit of 2nd data set |
| X | X | X | X | X |   |   |   | X |   | X |   | Determine by other bits | Determine by other bits |
| X | X | X | X | X |   |   |   | X |   |   | X | 2nd bit of 0th data set | 3rd bit of 3rd data set |
|   | X | X | X | X |   |   |   | X |   | X |   | 2nd bit of 0th data set | 1st bit of 2nd data set |
| X |   | X | X |   |   |   |   | X |   |   | X | 2nd bit of 0th data set | 0th bit of 2nd data set |
| X | X | X | X |   |   |   |   | X |   |   | X | 2nd bit of 0th data set | 1st bit of 3rd data set |
|   | X | X | X |   |   |   |   | X |   |   | X | 2nd bit of 0th data set | 2nd bit of 3rd data set |
| X | X | X |   |   |   |   |   | X |   |   | X | 3rd bit of 0th data set | 0th bit of 3rd data set |

Fig. 8

| cb0 | cb1 | cb2 | cb3 | cb4 | cb5 | cb6 | cb7 | cb8 | cb9 | cb10 | cb11 | 1st error bit | 2nd error bit |
|---|---|---|---|---|---|---|---|---|---|---|---|---|---|
| X | X | X |   |   |   |   |   |   | X |   |   | 3rd bit of 0th data set | 2nd bit of 1st data set |
| X | X |   | X |   |   |   |   | X |   | X |   | 3rd bit of 0th data set | 3rd bit of 2nd data set |
| X | X | X | X |   |   |   |   | X |   |   | X | 3rd bit of 0th data set | 3rd bit of 3rd data set |
| X | X | X |   |   |   |   |   | X | X |   |   | 3rd bit of 0th data set | 0th bit of 1st data set |
| X | X | X | X |   |   |   |   | X |   |   |   | 3rd bit of 0th data set | 2nd bit of 3rd data set |
| X | X | X | X |   |   |   |   |   |   |   | X | 3rd bit of 0th data set | 3rd bit of 1st data set |
| X | X | X | X | X |   |   |   |   | X |   |   | 1st bit of 1st data set | 2nd bit of 1st data set |
| X | X | X | X |   |   |   |   |   | X | X |   | 1st bit of 1st data set | 2nd bit of 2nd data set |
| X | X | X | X |   |   |   |   |   | X |   | X | Determine by other bits | Determine by other bits |
| X |   | X | X |   |   |   |   |   | X |   |   | 1st bit of 1st data set | 3rd bit of 1st data set |
| X |   | X |   | X |   |   |   |   |   |   | X | Determine by other bits | 0th bit of 1st data set |
| X | X | X | X |   |   |   |   |   | X | X |   | 1st bit of 1st data set | 1st bit of 2nd data set |
| X | X | X | X |   |   |   |   |   | X |   | X | 1st bit of 1st data set | 1st bit of 3rd data set |
| X | X | X | X |   |   |   |   |   | X |   | X | Determine by other bits | Determine by other bits |
| X | X | X |   |   |   |   |   |   |   |   |   | 2nd bit of 1st data set | 3rd bit of 1st data set |
|   | X | X | X |   |   |   |   |   | X | X |   | 2nd bit of 1st data set | 2nd bit of 2nd data set |
| X | X | X | X |   |   |   |   |   | X |   | X | 2nd bit of 1st data set | 3rd bit of 2nd data set |
| X | X | X | X |   |   |   |   |   | X |   | X | Determine by other bits | Determine by other bits |

| cb0 | cb1 | cb2 | cb3 | cb4 | cb5 | cb6 | cb7 | cb8 | cb9 | cb10 | cb11 | 1st error bit | 2nd error bit |
|---|---|---|---|---|---|---|---|---|---|---|---|---|---|
|   | X | X |   |   |   |   |   |   |   |   |   | 2nd bit of 1st data set | 0th bit of 1st data set |
| X | X | X | X | X |   |   |   |   |   |   |   | Determine by other bits | Determine by other bits |
|   | X | X | X |   |   |   |   |   | X |   |   | 2nd bit of 1st data set | 1st bit of 2nd data set |
| X | X | X | X |   |   |   |   |   | X |   |   | Determine by other bits | Determine by other bits |
|   | X | X | X | X |   |   |   |   | X |   |   | 2nd bit of 1st data set | 2nd bit of 3rd data set |
| X | X | X | X |   |   |   |   |   | X | X |   | 3rd bit of 1st data set | 2nd bit of 2nd data set |
| X | X | X | X |   |   |   |   |   | X | X |   | 3rd bit of 1st data set | 3rd bit of 2nd data set |
| X | X | X | X |   |   |   |   |   | X |   | X | 3rd bit of 1st data set | 3rd bit of 3rd data set |
| X | X | X |   |   |   |   |   |   |   | X |   | 3rd bit of 1st data set | 0th bit of 1st data set |
| X | X | X | X | X |   |   |   |   | X |   | X | 3rd bit of 1st data set | 0th bit of 2nd data set |
| X | X | X | X | X |   |   |   |   | X |   | X | Determine by other bits | Determine by other bits |
| X | X |   | X | X |   |   |   |   |   | X | X | 2nd bit of 2nd data set | 3rd bit of 2nd data set |
| X | X | X | X | X |   |   |   |   |   |   | X | 2nd bit of 2nd data set | 3rd bit of 3rd data set |
| X | X |   | X | X |   |   |   |   |   |   | X | 2nd bit of 2nd data set | 0th bit of 2nd data set |
|   | X | X | X | X |   |   |   |   |   | X | X | 2nd bit of 2nd data set | 1st bit of 2nd data set |
| X | X | X | X | X |   |   |   |   |   | X | X | Determine by other bits | Determine by other bits |
| X | X | X | X |   |   |   |   |   |   | X | X | 2nd bit of 2nd data set | 1st bit of 3rd data set |
| X | X | X | X |   |   |   |   |   | X | X |   | 3rd bit of 2nd data set | 2nd bit of 3rd data set |
| X | X | X | X |   |   |   |   |   |   | X | X | 3rd bit of 2nd data set | 3rd bit of 3rd data set |
| X | X | X |   | X |   |   |   |   |   |   |   | 3rd bit of 2nd data set | 0th bit of 1st data set |
| X |   | X | X | X |   |   |   |   |   |   |   | 3rd bit of 2nd data set | 0th bit of 2nd data set |

| cb0 | cb1 | cb2 | cb3 | cb4 | cb5 | cb6 | cb7 | cb8 | cb9 | cb10 | cb11 | 1st error bit | 2nd error bit |
|---|---|---|---|---|---|---|---|---|---|---|---|---|---|
| X | X |   | X |   |   |   |   |   |   | X |   | 3$^{rd}$ bit of 2$^{nd}$ data set | 0$^{th}$ bit of 3$^{rd}$ data set |
| X | X |   | X |   |   |   |   |   |   |   | X | 3$^{rd}$ bit of 2$^{nd}$ data set | 1$^{st}$ bit of 2$^{nd}$ data set |
| X | X | X | X |   |   |   |   |   |   | X |   | 3$^{rd}$ bit of 2$^{nd}$ data set | 2$^{nd}$ bit of 3$^{rd}$ data set |
| X | X | X | X | X |   |   |   |   |   |   | X | 3$^{rd}$ bit of 3$^{rd}$ data set | 0$^{th}$ bit of 2$^{nd}$ data set |
| X | X | X | X |   |   |   |   |   |   | X |   | 3$^{rd}$ bit of 3$^{rd}$ data set | 0$^{th}$ bit of 3$^{rd}$ data set |
| X | X | X | X |   |   |   |   |   |   |   | X | Determine by other bits | Determine by other bits |
| X | X | X | X |   |   |   |   |   |   | X |   | 3$^{rd}$ bit of 3$^{rd}$ data set | 1$^{st}$ bit of 3$^{rd}$ data set |
|   |   | X | X | X |   |   |   | X |   | X |   | 0$^{th}$ bit of 1$^{st}$ data set | 0$^{th}$ bit of 2$^{nd}$ data set |
| X |   | X | X |   |   |   |   |   | X | X |   | 0$^{th}$ bit of 1$^{st}$ data set | 1$^{st}$ bit of 2$^{nd}$ data set |
|   |   | X | X |   |   |   |   |   | X |   | X | 0$^{th}$ bit of 1$^{st}$ data set | 0$^{th}$ bit of 3$^{rd}$ data set |
| X |   |   | X | X |   |   |   |   |   | X |   | 1$^{st}$ bit of 2$^{nd}$ data set | 0$^{th}$ bit of 3$^{rd}$ data set |
| X |   | X | X | X |   |   |   |   |   |   | X | 0$^{th}$ bit of 2$^{nd}$ data set | 1$^{st}$ bit of 2$^{nd}$ data set |
|   | X | X | X | X |   |   |   |   |   | X |   | 0$^{th}$ bit of 2$^{nd}$ data set | 0$^{th}$ bit of 3$^{rd}$ data set |
|   | X | X | X |   |   |   |   |   |   | X |   | 0$^{th}$ bit of 2$^{nd}$ data set | 1$^{st}$ bit of 3$^{rd}$ data set |
| X | X | X | X |   |   |   |   |   |   |   | X | 1$^{st}$ bit of 2$^{nd}$ data set | 2$^{nd}$ bit of 3$^{rd}$ data set |
| X | X | X | X |   |   |   |   |   |   |   | X | 3$^{rd}$ bit of 3$^{rd}$ data set | 2$^{nd}$ bit of 3$^{rd}$ data set |
| X |   | X | X |   |   |   |   |   |   |   | X | 0$^{th}$ bit of 3$^{rd}$ data set | 1$^{st}$ bit of 3$^{rd}$ data set |
|   | X | X | X |   |   |   |   |   |   |   |   | 0$^{th}$ bit of 3$^{rd}$ data set | 2$^{nd}$ bit of 3$^{rd}$ data set |
| X | X | X | X |   |   |   |   |   |   |   |   | 1$^{st}$ bit of 3$^{rd}$ data set | 2$^{nd}$ bit of 3$^{rd}$ data set |

Fig.11

TWO BIT ERROR CALIBRATION DEVICE FOR 128 BIT TRANSFER AND THE METHOD FOR PERFORMING THE SAME

FIELD OF THE INVENTION

The present invention relates to error correction in data transfer, and in particular to a two bit error calibration device for 128 bit transfer and the device for performing the same

BACKGROUND OF THE INVENTION

ECC (Error-correcting code) is a technology for data error checking and correction in data transmission. As comparing with parity checking, ECC uses less data for data checking and correction. For example, for a data of 256 bits, it only uses 32 bit ECC check for data checking. When the amount of bits to be transferred is increased to be two times of the original bits, it only needs to increase one bit by using ECC checking. The ECC can allow the data error in data transmission and the data can be corrected so that the whole system can be operated normally.

In the prior art ECC technology, one bit error can be detected, but for two bits error, the system cannot correct and thus the stability of the system is affected.

In the present invention, checksum means an operation, in that an original bit string is divided into two halves, a front half and a rear half. Firstly, a new bit string is formed by the front half to subtract the rear half and a borrow is set. The means when the result is negative, a borrow flag (a first flag) is set to 1, if the result is positive, the borrow flag is set to 0. The same operation is applied to the new bit string, but at this stage, the subtraction is performed by the rear half to subtract the front half, and thus a further new bit string is got and a further borrow is got (a second flag). The process is repeated until the bit string is a one bit string (called as a last bit). Then a new reconstructed bit string is got. The reconstructed bit string has a same bit number as the original bit string, but has the form defined as the following:

0 0 0 . . . second-flag first-flag last bit

Then the same operation is applied to the reconstructed bit string, but at this stage, the subtraction is performed by the rear half to subtract the front half. Then, the same operation is performed, but in the second operation, the subtraction is performed by the front half to subtract the rear half. The process is repeated until bit string has only one bit which is the checksum of the original bit string.

For example, the original bit string is 11011111. It is divided into a font half 1101 and a rear half 1111. Then the operation of 1101-1111 is performed, which get a result of 1110 and a borrow 1. Then the sting 1110 is divided into a front half of 11 and a rear half 10. Then the 10-11 to get a result of 11 and a flag of 1. Finally, 1-1 is preformed to have a result of 0.

The final bit and the borrow flags are combined to has a new string of 00000110 which is divided into a front half of 0000 and a rear half of 0110. Then 0110-0000 to have a result of 0110. Then 01-10 is performed to have a result of 11. Then 1-1 is performed to have a result of 0. Therefore, the checksum of 11011111 is 0.

Another operation is a bit sum which defined as that: for two strings, the bits of the same position are summed. For example, for two strings 0110 and 1010, the first bit (addition of the last bits of the two strings) is 0+0, the second bit is 1+1 (=10), the third bit is 1+0, and the fourth bit is 0+1. The result is 10000.

The present invention proposes to provide a new method for checking and correcting two bit transmission errors for a transmission of 128 bits by using least operations so that the overall bits in transmission is least and thus the transmission quality is not affected by the checking and correction operation.

SUMMARY OF THE INVENTION

The present invention provides a method for determining two bits errors in transmission of 128 bits and the device for realization of this method. By the method and device of the present invention, the two error bits transferred bits can be determined and corrected by using least bits in operation. Therefore, the amount of data in transmission is increased with a least quantity and thus the transmission quality is not affected.

The present invention provides a two bit error calibration device for 128 bit transfer, comprising:

16 memories for data storage; each memory having four output ports;

two calibration chips each of which having four output ports;

a data bus for data transfer; the data bus including 64 receiving ports; each receiving port connected to a corresponding output port of the 16 memories; the data bus could receive 64 bits; the data bus further including 8 checking ports which are connected to the 8 output ports of the two calibration chips; wherein when the 64 receiving ports of the data bus receive data from the output ports of the 16 memories; the receiving operation is a two stage operation and thus totally 128 bit data is received; before data are written into the memory;

an operator connected to the data bus and the 16 memories for calculating the checksums and bit sums for above said data of 128 bits; wherein in the operator, the 128 bit data is stored as 32 data sets; each data set includes four bits; all the 128 bits from the 16 memories being divided into 32 data sets, in that, each data set includes four bits which are a $0^{th}$ bit (b0), a $1^{th}$ bit (b1), a $2^{th}$ bit (b2), and a $3^{th}$ bit (b3); totally, there are 128 bits which are the data read by the data bus; the operator calculating a calibration bit set from the 32 data sets; before data are written into the memory, all the stored data being operated for deriving the checksums and bit sums; the results of operation being transferred to the two calibration chips; wherein the calibration bit set includes 16 calibration bits which are stored in the two calibration chips; wherein the 16 calibration bits are $0^{th}$ calibration bit (cb0), $1^{th}$ calibration bit (cb1), $2^{th}$ calibration bit (cb2), $3^{th}$ calibration bit (cb3), $4^{th}$ calibration bit (cb4), $5^{th}$ calibration bit (cb5), $6^{th}$ calibration bit (cb6), $7^{th}$ calibration bit (cb7), $8^{th}$ calibration bit (cb8), $9^{th}$ calibration bit (cb9), $10^{th}$ calibration bit (cb10), $11^{th}$ calibration bit (cb11), $12^{th}$ calibration bit (cb12), $13^{th}$ calibration bit (cb13), $14^{th}$ calibration bit (cb14), and $15^{th}$ calibration bit (cb15);

a receiving end receiving the data transferred from the data bus, in that, the data includes the 128 bits data originally stored in the 16 memories and the 16 calibration bits originally stored in the calibration chips;

a comparator in the receiving end for calculating the same operations of checksums and bit sums for the received data so as to derive another calibration bit set which includes 16 calibration bits; the calibration bits derived in the comparator from 128 bits transferred to the receiving end is compared with the calibration bits transferred from the calibration bit set originally stored in the two calibration chips as so to determine which two bits of the 128 bits are deviated

DETAILED DESCRIPTION OF THE INVENTION

In order that those skilled in the art can further understand the present invention, a description will be provided in the following in details. However, these descriptions and the appended drawings are only used to cause those skilled in the art to understand the objects, features, and characteristics of the present invention, but not to be used to confine the scope and spirit of the present invention defined in the appended claims.

With reference to FIGS. 1 to 11, the new method for checking and correcting two bit transmission errors for a transmission of 128 bits by using least operations according to the present invention is provided. The present invention includes the following elements.

Figure 1:
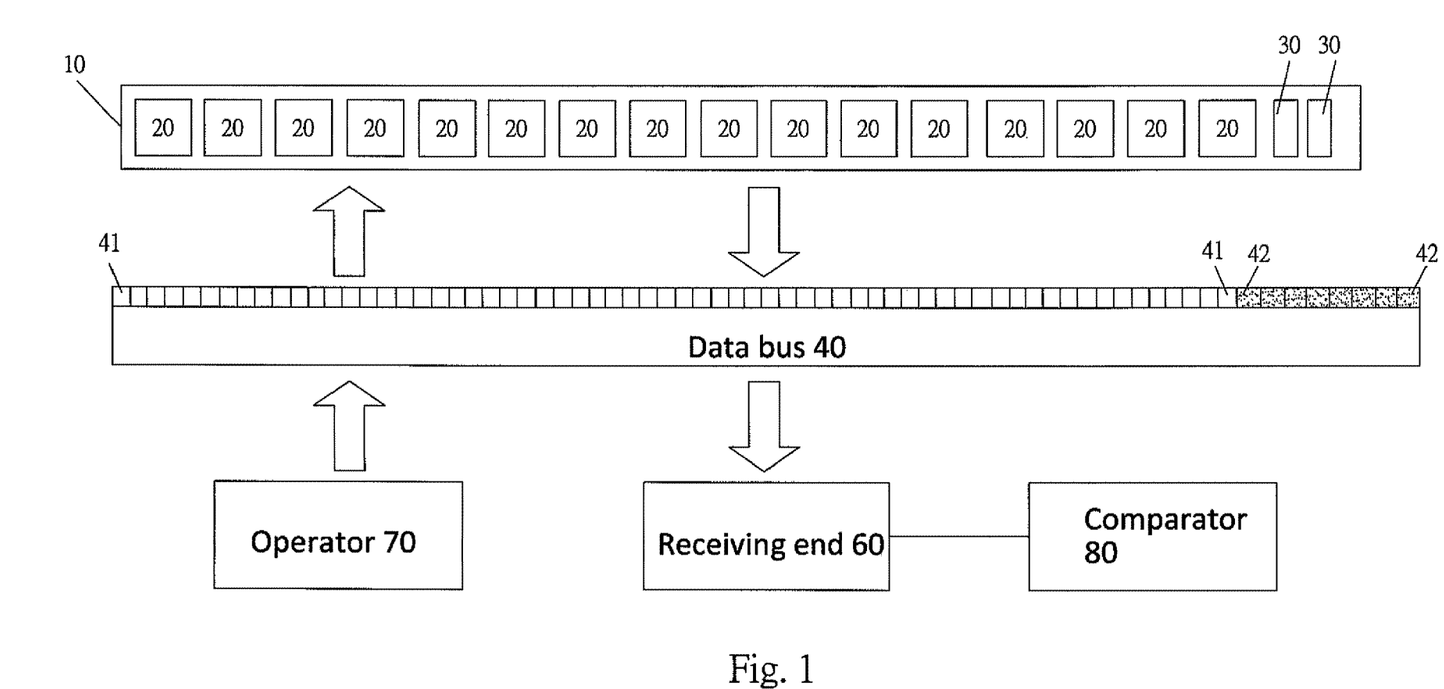
FIG. 1 is an assembly schematic view showing the elements of the present invention.

A substrate 10 is used;

16 memories 20 are arranged on the substrate 10. The 16 memories 20 serve to store data. Each memory 20 has four output ports 25.

Two calibration chips 30 are positioned on the substrate 10. Each calibration chip 30 has four output ports 35.

Figure 5:
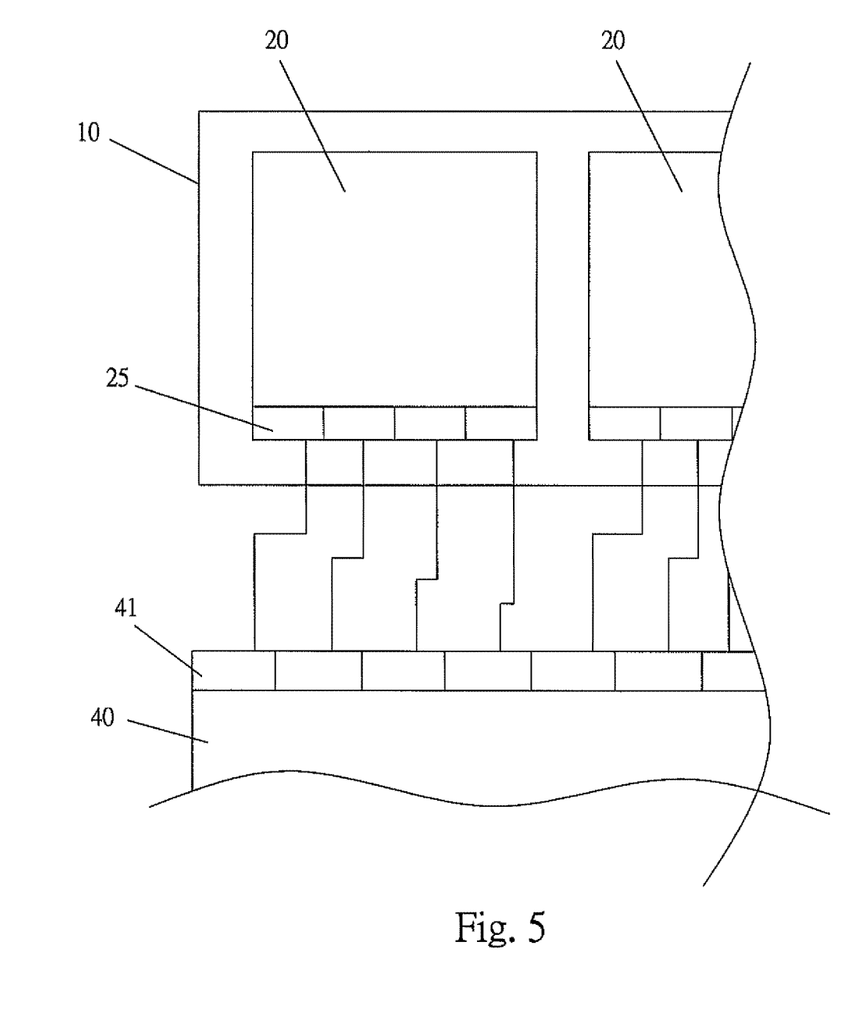
FIG. 5 is a partial schematic view showing the connection of the memories and the data bus of the present invention.

A data bus 40 serves to transfer data. The data bus 40 includes 64 receiving ports 41. Each receiving port 41 is connected to a corresponding output port 25. The data bus 40 could receive 64 bits, as illustrated in FIG. 1. The receiving ports 41 serves to be connected to the output ports 25 of the 16 memories 20, as illustrated in FIG. 5.

Figure 6:
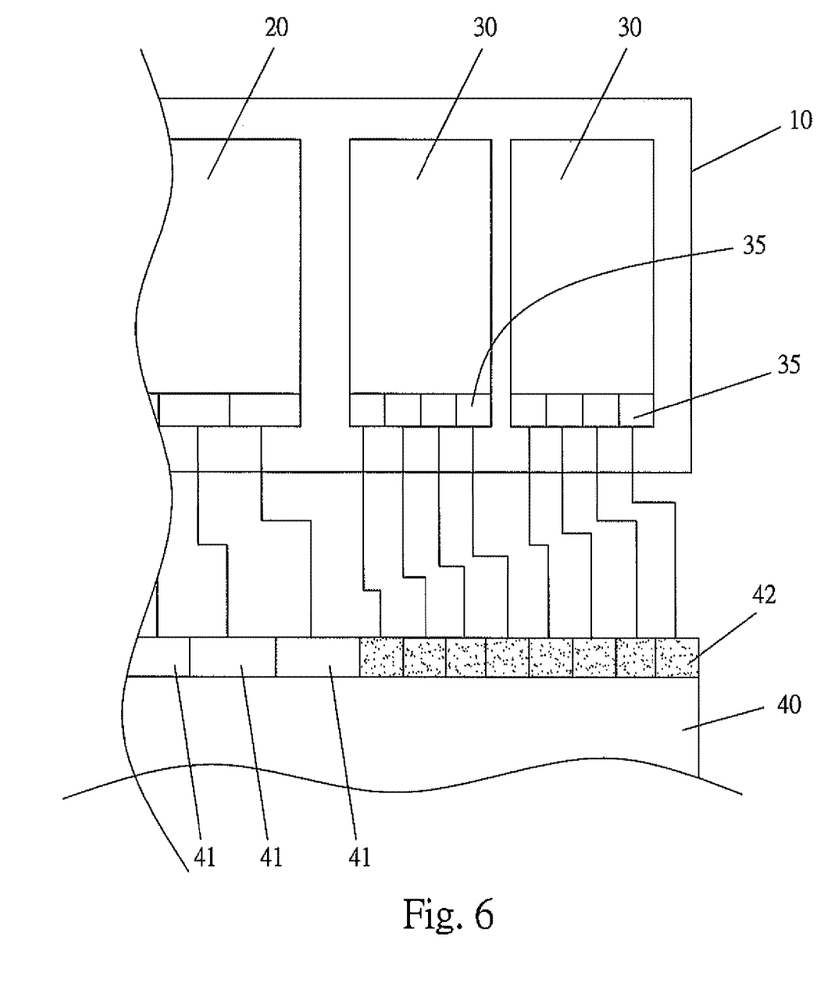
FIG. 6 is a partial schematic view showing the connection of the calibration chips and the data bus of the present invention.

Furthermore, the data bus 40 further includes 8 checking ports 42 which are connected to the 8 output ports 35 of the two calibration chips 30, as illustrated in FIG. 6.

When the 64 receiving ports 41 of the data port 40 receive data from the output ports 25 of the 16 memories 20, the receiving operation is a two stage operation and thus totally 128 bit data is received.

Figure 2:
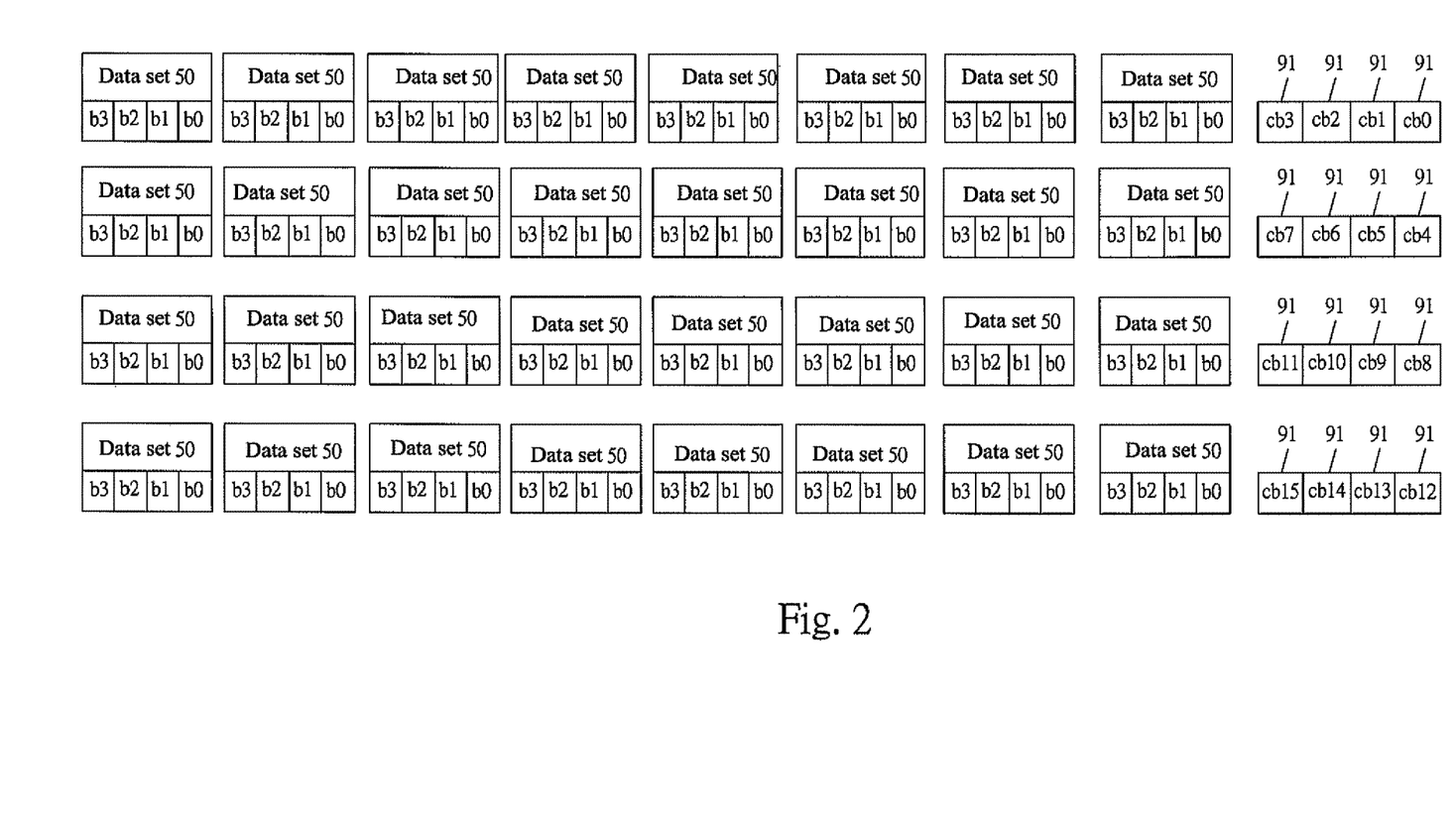
FIG. 2 is a schematic view showing the data sets and the calibration bits of the present invention.

The present invention further includes an operator 70 which is connected to the data bus 40 and the 16 memories 20 for calculating checksums and bit sums for above said data of 128 bits. In the operator, the 128 bit data is stored as 32 data sets 50. Each data set 50 includes four bits. All the 128 bits from the 16 memories 20 are divided into 32 data sets 50, which are a $0^{th}$ data set 50, a first data set 50, a second data set 50, a third data set 50, ..., a 31 data set 50, as illustrated in FIG. 2. In that, each data set 50 includes four bits which are a $0^{th}$ bit b0, a $1^{th}$ bit b1, a $2^{th}$ bit b2, and a $3^{th}$ bit b3. Totally, there are 128 bits which are the data read by the data bus 40.

The operator 70 calculates a calibration bit set 90 from the 32 data sets 50.

Before data are written into the memory 20, all the stored data are operated for calculation and deriving the checksums and bit sums. The results of operation are transferred to the two calibration chips 30.

Figure 3:
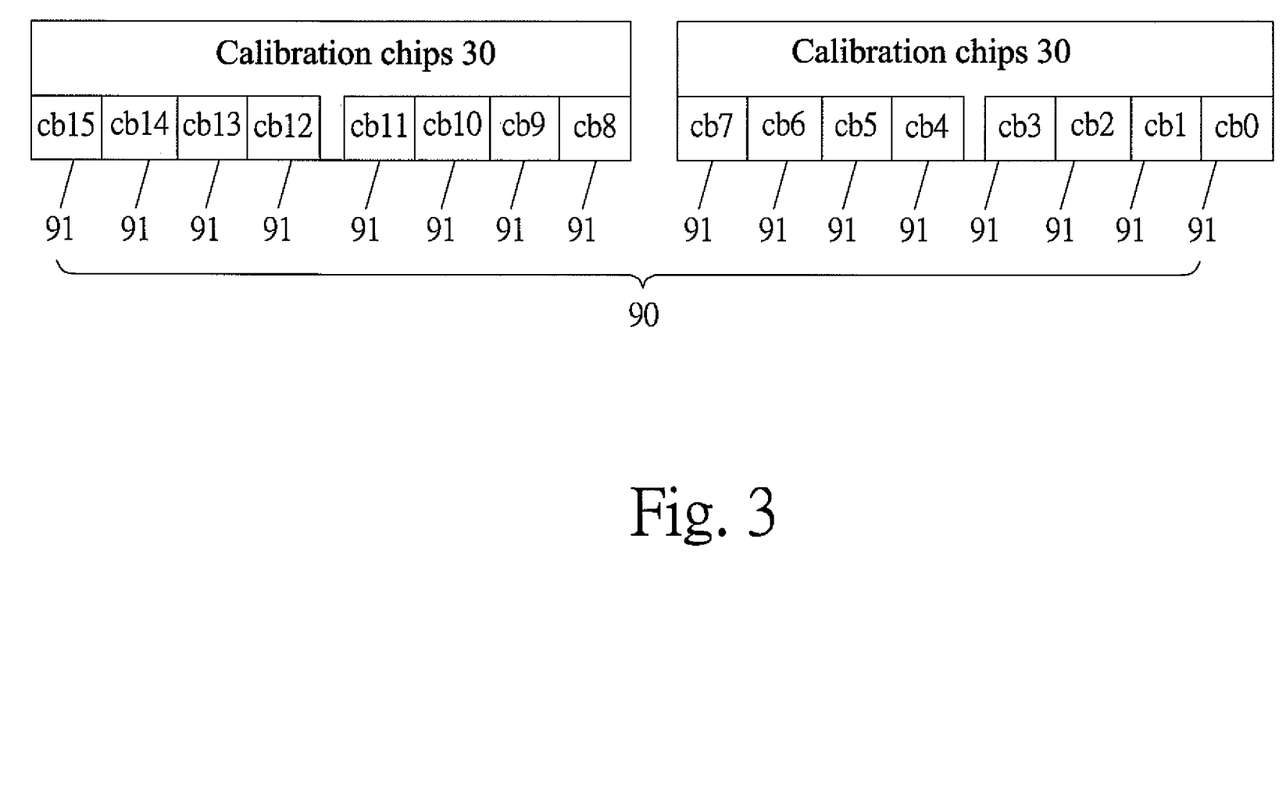
FIG. 3 is schematic view showing the calibration chips and the calibration bit sets of the present invention.

The calibration bit set 90 includes 16 calibration bits 91 which are stored in the two calibration chips 30. In the 16 calibration bits 91, four of the calibration bits 91 are assembled as one set, as illustrated in FIG. 3.

The 19 calibration bits 91 are $0^{th}$ calibration bit cb0, $1^{th}$ calibration bit cb1, $2^{th}$ calibration bit cb2, $3^{th}$ calibration bit cb3, $4^{th}$ calibration bit cb4, $5^{th}$ calibration bit cb5, $6^{th}$ calibration bit cb6, $7^{th}$ calibration bit cb7, $8^{th}$ calibration bit cb8, $9^{th}$ calibration bit cb9, $10^{th}$ calibration bit cb10, $11^{th}$ calibration bit cb11, $12^{th}$ calibration bit cb12, $13^{th}$ calibration bit cb13, $14^{th}$ calibration bit cb14, and $15^{th}$ calibration bit cb15.

In data transferring, the receiving end 60 receives the data from the data bus 40, in that, the data includes the 128 bits data originally stored in the 16 memories 20 and the 16 calibration bits 91 originally stored in the calibration chips 30. Then a comparator 80 calculates the same operations of checksums and bit sums for the received data so as to derive another calibration bit set 90 which includes 16 calibration bits 91. The calibration bits 91 derived in the comparator 80 from 128 bits transferred to the receiving end is compared with the calibration bits 91 transferred from the calibration bit set 91 originally stored in the two calibration chips 30 as so to determine which two bits of the 128 bits are deviated in transfer.

Based on the received data in the receiving end 60, the data comparator 80 calculates the $0^{th}$ calibration bit cb0, $1^{th}$ calibration bit cb1, $1^{th}$ calibration bit cb1, $2^{th}$ calibration bit cb2, $3^{th}$ calibration bit cb3, $4^{th}$ calibration bit cb4, $5^{th}$ calibration bit cb5, $6^{th}$ calibration bit cb6, and $7^{th}$ calibration bit cb7; the $8^{th}$ calibration bit cb8, the $9^{th}$ calibration bit cb9, $10^{th}$ calibration bit cb10, $11^{th}$ calibration bit cb11, $12^{th}$ calibration bit cb12, $13^{th}$ calibration bit cb13, $14^{th}$ calibration bit cb14, and $15^{th}$ calibration bit cb15 derived in the original 16 memories 20.

Then the data comparator 80 compares all the calibration bits 91 based on the received data with all the calibration bits 91 originally stored in the calibration chips 30.

All the calibration bits 91 are defined as the following:

The $0^{th}$ calibration bit cb0=checksum of a bit string which is formed by a sequential assembly of all the $1^{th}$ bit b1 and the $3^{th}$ bits of all the data sets 50.

For example, to simplify, we assume that only four data sets 50 and $0^{th}$ data set 50 is 0011, $1^{th}$ data set 50 is 1101,
$2^{th}$ data set 50 is 1011,
$3^{th}$ data set 50 is 0000,
Then the assembly of the bit stream is 01101100. Then operation of checksum is used to this bit string for getting the $0^{th}$ calibration bits cb0.

In the present invention, indeed, there are 32 data sets 50.

The $1^{th}$ calibration bit cb1=checksum of a bit string which is formed by a sequential assembly of the $2^{th}$ bit b2 and the $3^{th}$ bits of all the data sets 50 wherein one of the 16 calibration bits 91 is the checksum of a bit string which is formed by a sequential assembly of all the bits of the $1^{th}$, $3^{th}$, $5^{th}$, $7^{th}$, $9^{th}$, $11^{th}$, $13^{th}$, $15^{th}$, $17^{th}$, $19^{th}$, $21^{th}$, $23^{th}$, $25^{th}$, $27^{th}$, $29^{th}$, $31^{th}$ data sets 50, that is:

The $2^{th}$ calibration bit cb2=checksum of a bit string which is formed by a sequential assembly of all the bits of the $1_{th}$, $3^{th}$, $5^{th}$, $7^{th}$, $9^{th}$, $11^{th}$, $13^{th}$, $15^{th}$, $17^{th}$, $19^{th}$, $21^{th}$, $23^{th}$, $25^{th}$, $27^{th}$, $29^{th}$, $31^{th}$ data sets 50.

The $3^{th}$ calibration bit cb3=checksum of a bit string which is formed by a sequential assembly of all the bits of the $2^{th}$, $3^{th}$, $6^{th}$, $7^{th}$, $10^{th}$, $11^{th}$, $14^{th}$, $15^{th}$, $18^{th}$, $19^{th}$, $22^{th}$, $23^{th}$, $26^{th}$, $27^{th}$, $30^{th}$, $31^{th}$ data sets 50.

The $4^{th}$ calibration bit cb4=checksum of a bit string which is formed by a sequential assembly of $0^{th}$ bit b0 and the $2^{th}$ bit b2 of the $0^{th}$, $2^{th}$, $4^{th}$, $6^{th}$, $8^{th}$, $10^{th}$, $12^{th}$, $14^{th}$, $6^{th}$, $18^{th}$, $20^{th}$, $22^{th}$, $24^{th}$, $26^{th}$, $28^{th}$, $30^{th}$, data sets 50.

The $5^{th}$ calibration bit cb5=checksum of a bit string which is formed by a sequential assembly of all the bits of the $4^{th}$, $5^{th}$, $6^{th}$, $7^{th}$, $12^{th}$, $13^{th}$, $14^{th}$, $15^{th}$, $20^{th}$, $21^{th}$, $22^{th}$, $23^{th}$, $28^{th}$, $29^{th}$, $30^{th}$, $31^{th}$, data sets 50.

The $6^{th}$ calibration bit cb6=checksum of a bit string which is formed by a sequential assembly of all the bits of the $8^{th}$, $9^{th}$, $10^{th}$, $11^{th}$, $12^{th}$, $13^{th}$, $14^{th}$, $15^{th}$, $24^{th}$, $25^{th}$, $26^{th}$, $27^{th}$, $28^{th}$, $29^{th}$, $30^{th}$, $31^{th}$, data sets 50.

The $7^{th}$ calibration bit cb7=checksum of a bit string which is formed by a sequential assembly of all the bits of the $16^{th}$, $17^{th}$, $18^{th}$, $19^{th}$, $20^{th}$, $21^{th}$, $22^{th}$, $23^{th}$, $24^{th}$, $25^{th}$, $26^{th}$, $27^{th}$, $28^{th}$, $29^{th}$, $30^{th}$, $31^{th}$, data sets 50.

The $8^{th}$ calibration bit cb8=bit sum of all the bits of the $0^{th}$, $4^{th}$, $8^{th}$, $12^{th}$, $16^{th}$, $20^{th}$, $24^{th}$, $28^{th}$ data sets 50.

The $9^{th}$ calibration bit cb9=bit sum of all the bits of the $1^{th}$, $5^{th}$, $9^{th}$, $13^{th}$, $17^{th}$, $21^{th}$, $25^{th}$, $29^{th}$ data sets 50.

The $10^{th}$ calibration bit cb10=bit sum of all the bits of the $2^{th}$, $6^{th}$, $10^{th}$, $14^{th}$, $18^{th}$, $22^{th}$, $26^{th}$, $30^{th}$ data sets 50.

The $11^{th}$ calibration bit cb11=bit sum of all the bits of the $3^{th}$, $7^{th}$, $11^{th}$, $15^{th}$, $19^{th}$, $23^{th}$, $27^{th}$, $31^{th}$ data sets 50.

The $12^{th}$ calibration bit cb12=bit sum of all the bits of the data sets 50.

The $13^{th}$ calibration bit cb13=bit sum of all the bits of the data sets 50.

The $14^{th}$ calibration bit cb14=bit sum of all the bits of the data sets 50.

The $15^{th}$ calibration bit cb15=bit sum of all the bits of the data sets 50.

The calibration bits cb2, cb3, cb5, cb6, cb7, cb8, cb9, cb10, cb11 are used to determine two data sets 50 which contains two error bits. In determination of the two data sets 50 containing the two error transferred bits, that is, two bits which are incorrect as compared with the bits originally transferred from the 16 memories 20. All the nine calibration bits cb2, cb3, cb5, cb6, cb7, cb8, cb9, cb10, cb11 can be used, or only parts of the nine calibration bits cb2, cb3, cb5, cb6, cb7, cb8, cb9, cb10, cb11 are used.

The calibration bits cb0, cb1, cb4, cb12, cb13, cb14, cb15, cb11 are used to determine positions of the two data sets 50 in which the two error transferred bits exist. It is possibly that the two error transferred bits are existed at two different data sets 50 or at the same data set 50. All the seven calibration bits cb0, cb1, cb4, cb12, cb13, cb14, cb15, cb11 can be used, or parts of the calibration bits cb0, cb1, cb4, cb12, cb13, cb14, cb15, cb11 are used.

The table shown in FIGS. 7 to 11 shows if the errors occur at two different calibration bits 91, the corresponding positions of the error transferred bits in the corresponding data sets 50.

Figure 7:
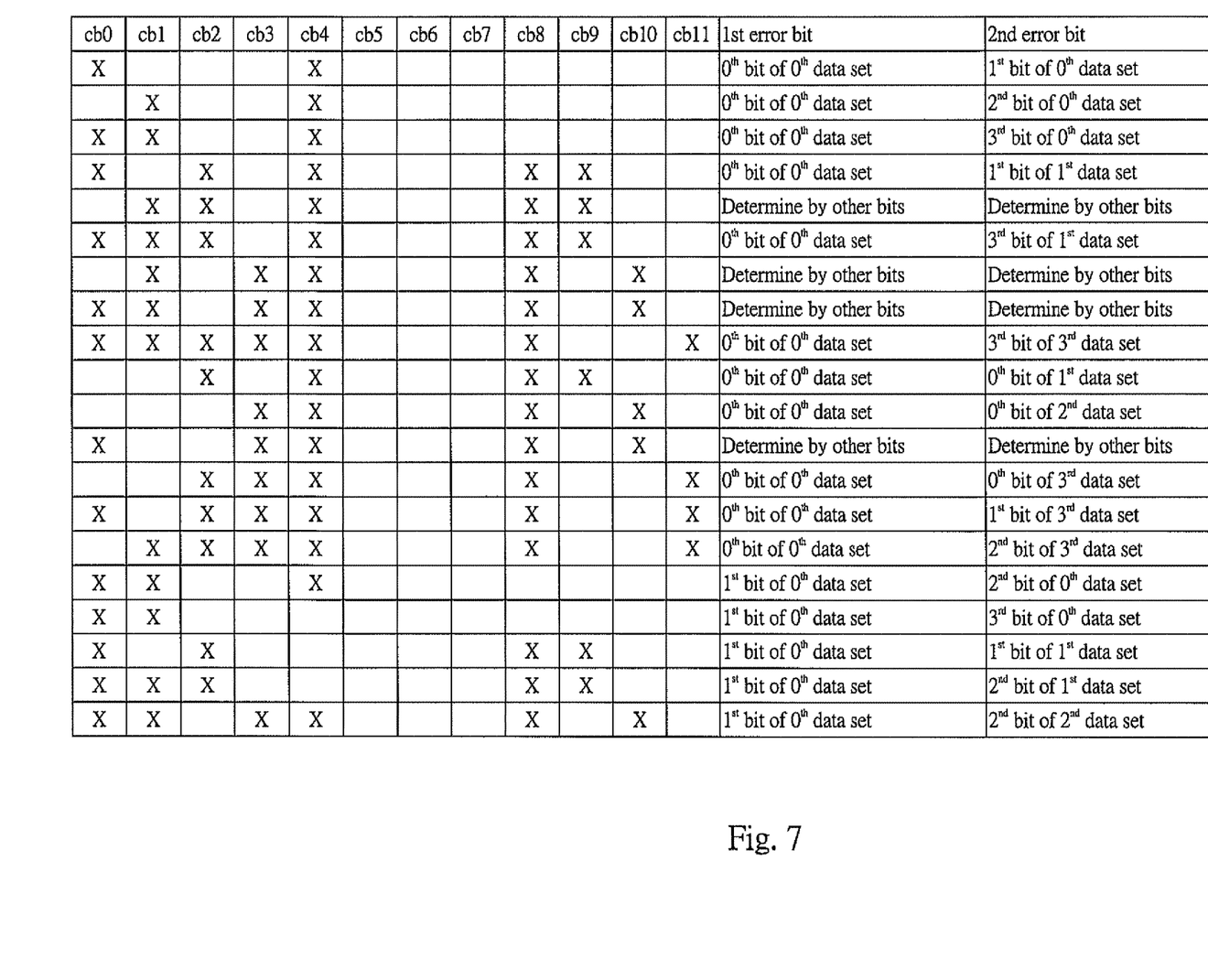
FIG. 7 is a table showing relation of the error calibration bits with the respect error positions in the data set.
Figure 8:
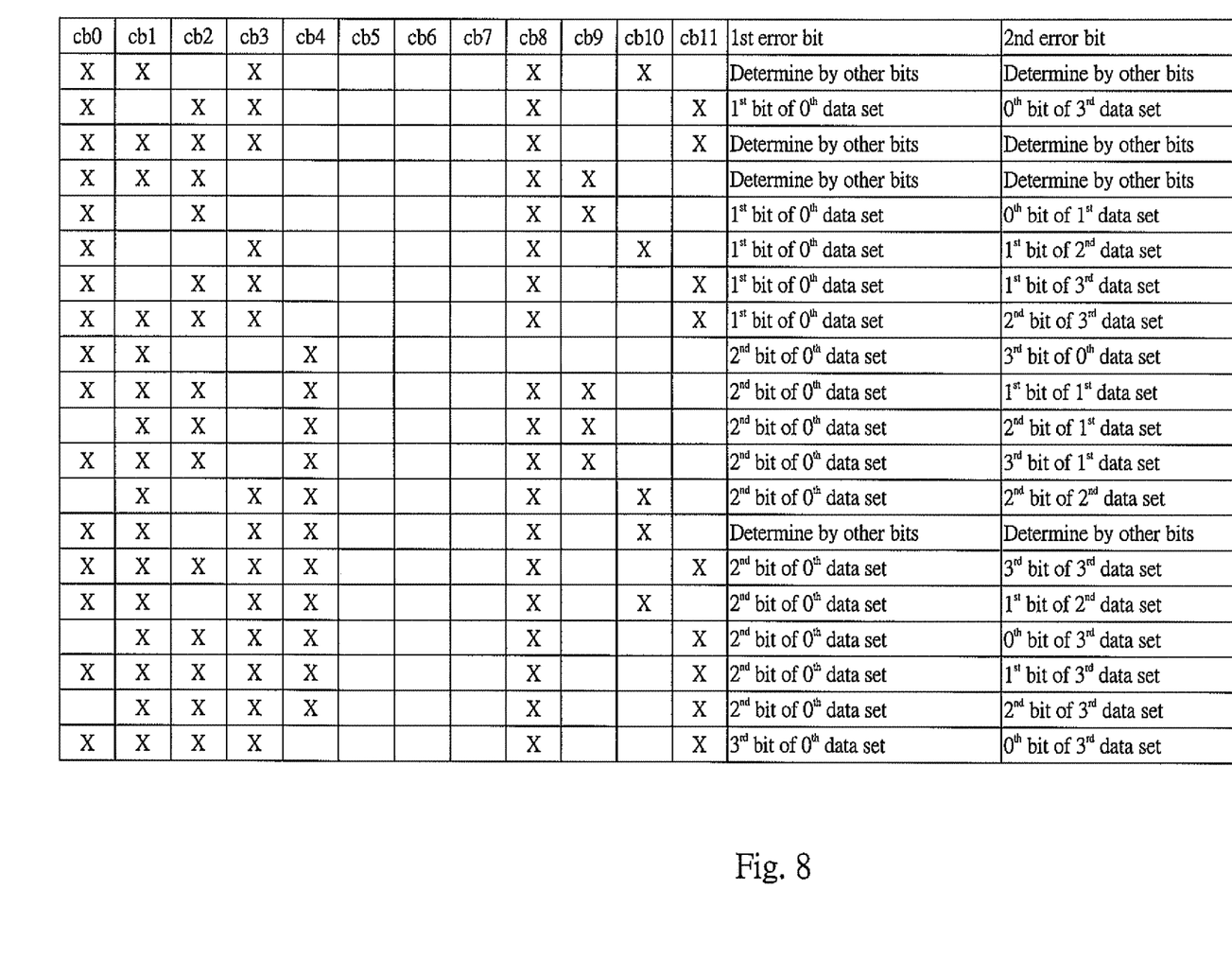
FIG. 8 is another table showing relation of the error calibration bits with the respect error positions in the data set.
Figure 9:
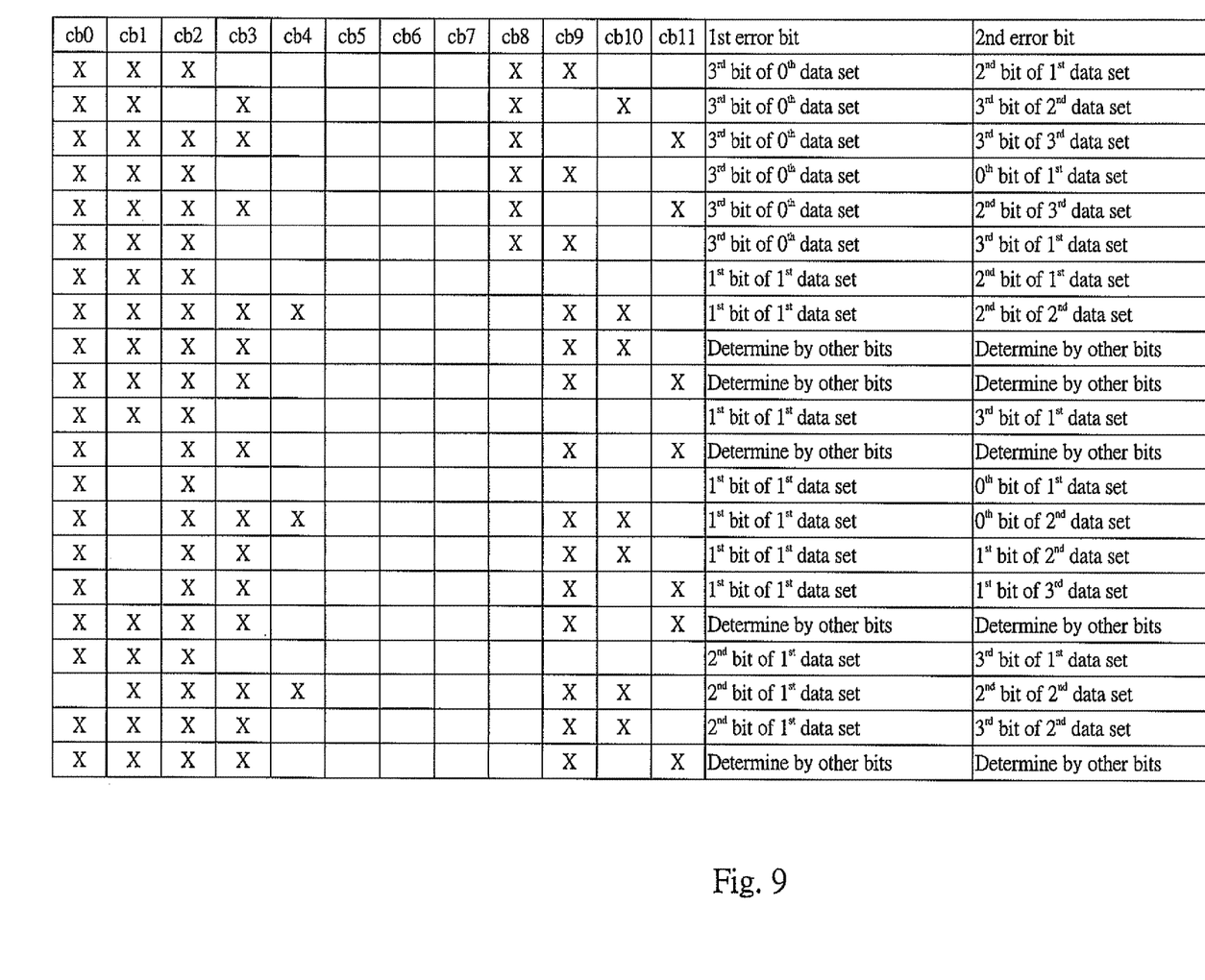
FIG. 9 is a yet table showing relation of the error calibration bits with the respect error positions in the data set.
Figure 10:
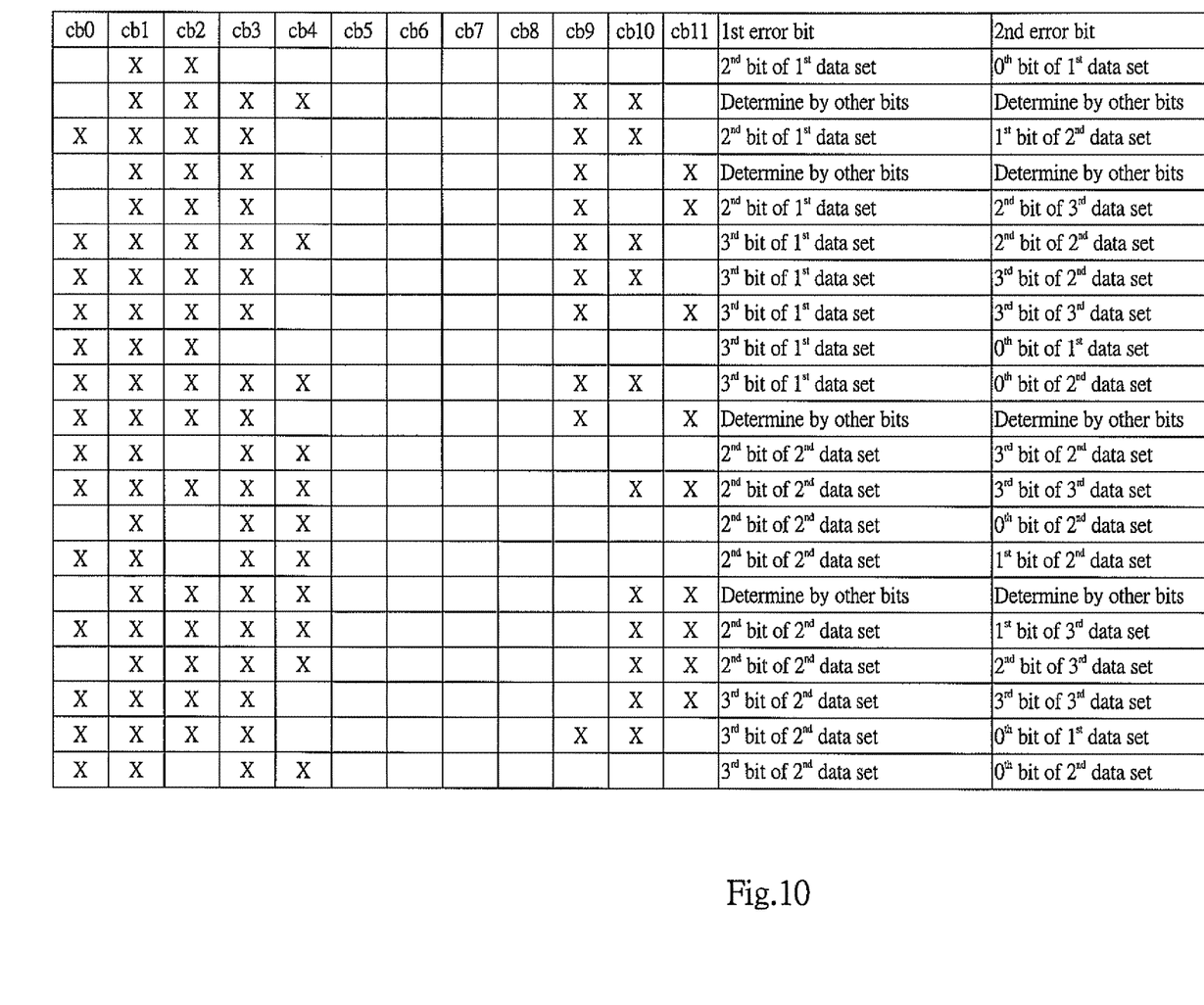
FIG. 10 is a further table showing relation of the error calibration bits with the respect error positions in the data set.
Figure 11:
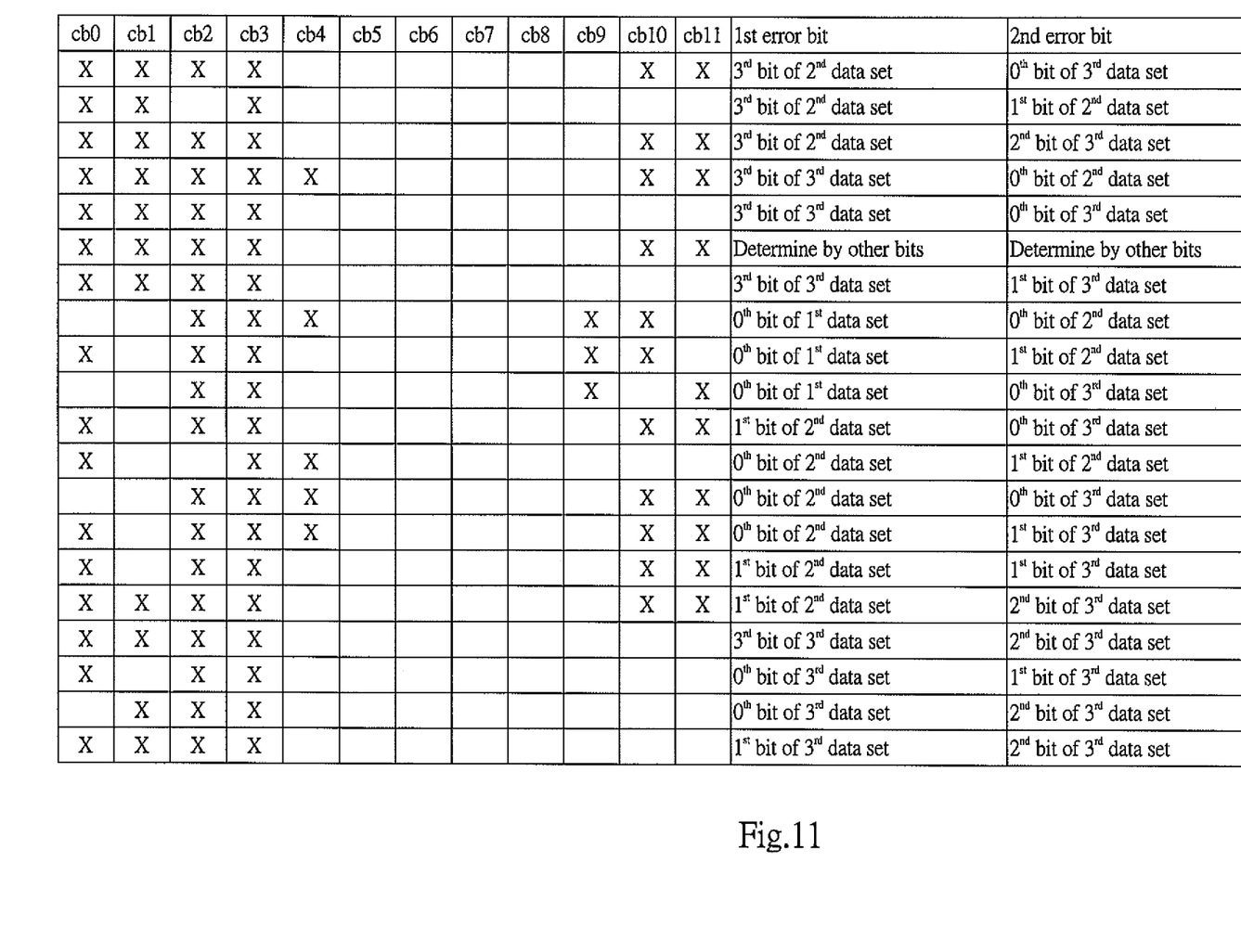
FIG. 11 is a still table showing relation of the error calibration bits with the respect error positions in the data set.

For example, referring to the first line of FIG. 7, in the comparison of the transferred calibration bits calculated from the transferred data in the receiving end 60 and the original calibration bits calculated from the data originally stored in the memory 20 by the comparator 80, it finds that the transferred calibration bit cb0 is different from the original calibration bit cb0 and the transferred calibration bit cb4 is different from the original calibration bit cb4, it can conclude that the error transferred data are at $0^{th}$ bit in the $0^{th}$ data set 50 and the $1^{th}$ bit in the $0^{th}$ data set 50.

If there is one bit error in the received 128 bit, it will be different on the checksums and bit sums. From the table shown in FIGS. 7 to 11, the data set 50 and the position having the bit errors will be got. Then changing the bit from 0 to 1, or from 1 to 0 will correct the bit error.

Figure 4:
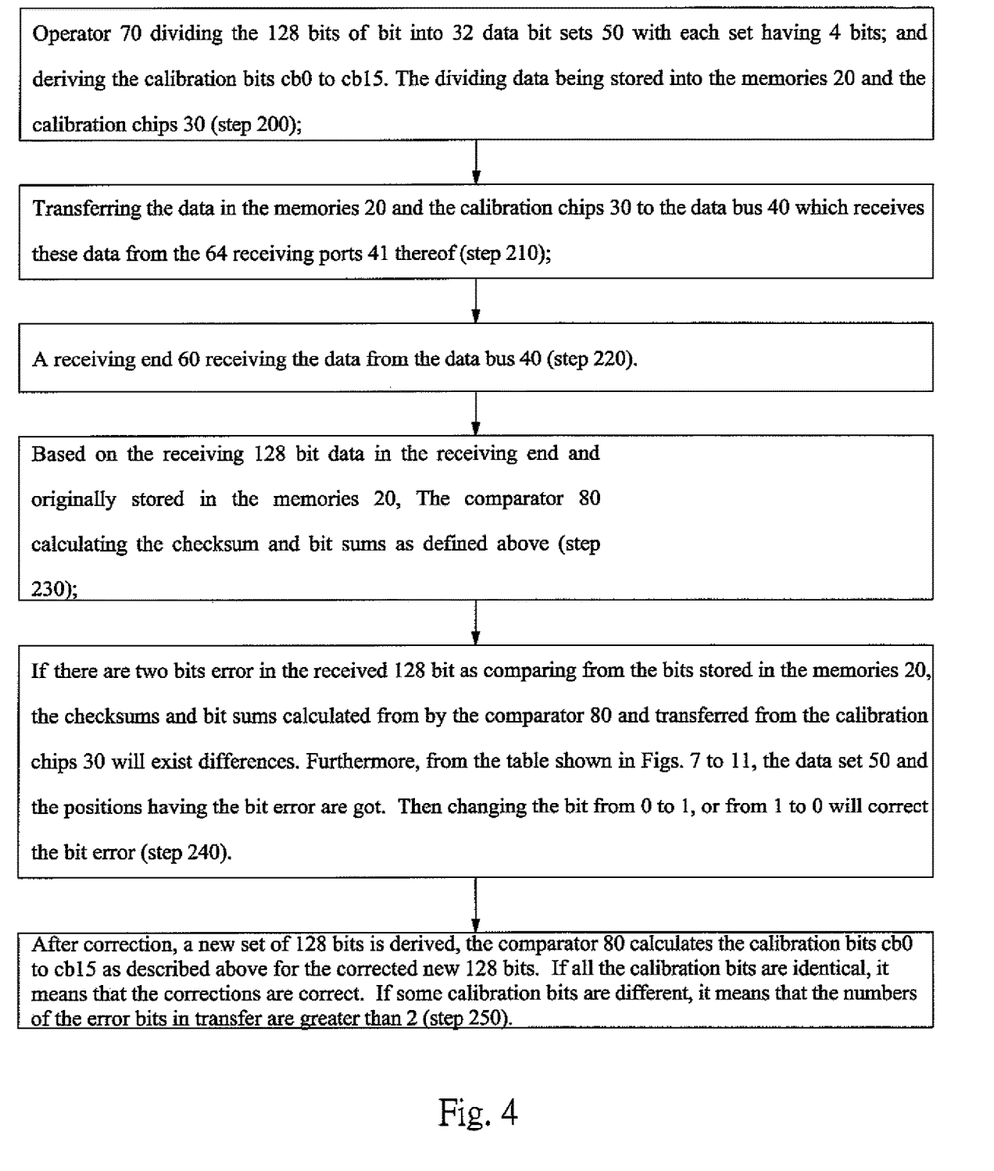
FIG. 4 shows the operation flow diagram of the present invention.

FIG. 4 shows the method for error correction by using above mentioned device. The method includes the following step of:

Before storing a data of 128 bits into the 16 memories 20, the operator 70 dividing the 128 bits of bit into 32 data bit sets 50 with each set having 4 bits; and deriving the calibration bits cb0 to cb15 as defined above; the ways for arranging these data as described above. The dividing data being stored into the 16 memories 20 and the calibration chips 30 (step 210);

Transferring the data in the 16 memories 20 and the calibration chips 30 to the data bus 40 which receives these data from the 64 receiving ports 41 thereof; 128 bit data being received in two times from the 64 receiving ports 41 (step 210); A receiving end 60 receiving the data from the data bus 40 (step 220).

Based on the receiving 128 bit data in the receiving end and originally stored in the 16 memories 20, The comparator 80 calculating the checksum and bit sums as defined above (step 230);

If there are two bits error in the received 128 bit as comparing from the bits stored in the 16 memories 20, the checksums and bit sums calculated from by the comparator 80 and transferred from the calibration chips 30 will exist differences. Furthermore, from the table shown in FIGS. 7 to 11, the data set 50 and the positions having the bit error are got. Then changing the bit from 0 to 1, or from 1 to 0 will correct the bit error (step 240).

After correction, a new set of 128 bits is derived, the comparator 80 calculates the calibration bits cb0 to cb15 as described above for the corrected new 128 bits. The results are compared with the calibration bits cb0 to cb15 originally stored in the calibration chips 30. If all the calibration bits are identical, it means that the corrections are correct. If some calibration bits are different, it means that the numbers of the error bits in transfer are greater than 2 (step 250).

In use of the present invention, firstly, to check whether there is a one bit error in transmission of the 128 bits by the method for checking the one bit error (which is known in the prior art). If the error is not a one bit error, than the method of the present invention is used to check whether the transmission error is two bits. Above mentioned method of the present invention can be used to determine two bit errors. Furthermore, the present invention further provides a method to determine whether the number of error bits are greater than two. If it is not greater than two and not one, then the method of the present invention provides a method to correct the two bit errors in transmission.

The present invention provides a method for determining two bits errors in transmission of 128 bits and the device for realization of this method. By the method and device of the present invention, the two error bits transferred bits can be determined and corrected by using least bits in operation. Therefore, the amount of data in transmission is increased with a least quantity and thus the transmission quality is not affected.

The present invention is thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A two bit error calibration device for 128 bit transfer, comprising:
    16 memories for data storage; each memory having four output ports;
    two calibration chips each of which having four output ports;
    a data bus for data transfer; the data bus including 64 receiving ports; each receiving port connected to a corresponding output port of the 16 memories; the data bus could receive 64 bits; the data bus further including 8 checking ports which are connected to the 8 output ports of the two calibration chips; wherein when the 64 receiving ports of the data bus receive data from the output ports of the 16 memories; the receiving operation is a two stage operation and thus totally 128 bit data is received; before data are written into the memory;
    an operator connected to the data bus and the 16 memories for calculating checksums and bit sums for above said data of 128 bits; wherein in the operator, the 128 bit data is stored as 32 data sets; each data set includes four bits; all the 128 bits from the 16 memories being divided into 32 data sets, in that, each data set includes four bits which are a $0^{th}$ bit (b0), a $1^{th}$ bit (b1), a $2^{th}$ bit (b2), and a $3^{th}$ bit (b3); totally, there are 128 bits which are the data read by the data bus; the operator calculating a calibration bit set from the 32 data sets; before data are written into the memory, all the stored data being operated for deriving the checksums and bit sums; the results of operation being transferred to the two calibration chips; wherein the calibration bit set includes 16 calibration bits which are stored in the two calibration chips; wherein the 16 calibration bits are $0^{th}$ calibration bit (cb0), $1^{th}$ calibration bit (cb1), $2^{th}$ calibration bit (cb2), $3^{th}$ calibration bit (cb3), $4^{th}$ calibration bit (cb4), $5^{th}$ calibration bit (cb5), $6^{th}$ calibration bit (cb6), $7^{th}$ calibration bit (cb7), $8^{th}$ calibration bit (cb8), $9^{th}$ calibration bit (cb9), $10^{th}$ calibration bit (cb10), $11^{th}$ calibration bit (cb11), $12^{th}$ calibration bit (cb12), $13^{th}$ calibration bit (cb13), $14^{th}$ calibration bit (cb14), and $15^{th}$ calibration bit (cb15);
    a receiving end receiving the data transferred from the data bus, in that, the data includes the 128 bits data originally stored in the 16 memories and the 16 calibration bits originally stored in the calibration chips;
    a comparator in the receiving end for calculating the checksums and bit sums for the received data so as to derive another calibration bit set which includes 16 calibration bits; the calibration bits derived in the comparator from 128 bits transferred to the receiving end is compared with the calibration bits transferred from the calibration bit set originally stored in the two calibration chips as so to determine which two bits of the 128 bits are deviated in transfer; and
    wherein the data comparator compares all the calibration bits based on the received data with all the calibration bits 91 originally stored in the calibration chips.

2. The two bit error calibration device for 128 bit transfer as claimed in claim 1, wherein the 16 calibration bits include nine calibration bits for determining two data sets having two error transferred bits.

3. The two bit error calibration device for 128 bit transfer as claimed in claim 2, wherein the 16 calibration bits include seven calibration bits for determining two data sets having two error transferred bits, respectively, or determining one data set having two error transferred bits.

4. The two bit error calibration device for 128 bit transfer as claimed in claim 3, wherein the seven calibration bits are:
    the $0^{th}$ calibration bit (cb0)=checksum of a bit string which is formed by a sequential assembly of all the $1^{th}$ bit (b1) and the $3^{th}$ bits of all the data sets;
    the $1^{th}$ calibration bit (cb1)=checksum of a bit string which is formed by a sequential assembly of the $2^{th}$ bit (b2) and the $3^{th}$ bits of all the data sets;
    the $4^{th}$ calibration bit (cb4)=checksum of a bit string which is formed by a sequential assembly of $0^{th}$ bit (b0) and the $2^{th}$ bit (b2) of the $0^{th}$, $2^{th}$, $4^{th}$, $6^{th}$, $8^{th}$, $10^{th}$, $12^{th}$, $14^{th}$, $16^{th}$, $18^{th}$, $20^{th}$, $22^{th}$, $24^{th}$, $26^{th}$, $28^{th}$, $30^{th}$, data sets;
    the $12^{th}$ calibration bit (cb12)=bit sum of all the bits of the data sets;
    the $13^{th}$ calibration bit (cb13)=bit sum of all the bits of the data sets;
    the $14^{th}$ calibration bit (cb14)=bit sum of all the bits of the data sets; and
    the $15^{th}$ calibration bit (cb15)=bit sum of all the bits of the data sets.

5. The two bit error calibration device for 128 bit transfer as claimed in claim 4, wherein
    the $0^{th}$ calibration bit (cb0)=checksum of a bit string which is formed by a sequential assembly of all the $1^{th}$ bit (b1) and the $3^{th}$ bits of all the data sets;
    the $1^{th}$ calibration bit (cb1)=checksum of a bit string which is formed by a sequential assembly of the $2^{th}$ bit (b2) and the $3^{th}$ bits of all the data sets;
    the $4^{th}$ calibration bit (cb4)=checksum of a bit string which is formed by a sequential assembly of $0^{th}$ bit (b0) and the $2^{th}$ bit (b2) of the $0^{th}$, $2^{th}$, $4^{th}$, $6^{th}$, $8^{th}$, $10^{th}$, $12^{th}$, $14^{th}$, $16^{th}$, $18^{th}$, $20^{th}$, $22^{th}$, $24^{th}$, $26^{th}$, $28^{th}$, $30^{th}$ data sets are use to determine that positions of two data sets have the two error bits or positions of one data set have the two error bits.

6. The two bit error calibration device for 128 bit transfer as claimed in claim 2, wherein the nine calibration bits are:
    the $2^{th}$ calibration bit (cb2)=checksum of a bit string which is formed by a sequential assembly of all the bits of the $1^{th}$, $3^{th}$, $5^{th}$, $7^{th}$, $9^{th}$, $11^{th}$, $13^{th}$, $15^{th}$, $17^{th}$, $19^{th}$, $21^{th}$, $23^{th}$, $25^{th}$, $27^{th}$, $29^{th}$, $31^{th}$ data sets;
    the $3^{th}$ calibration bit (cb3)=checksum of a bit string which is formed by a sequential assembly of all the bits of the $2^{th}$, $3^{th}$, $6^{th}$, $7^{th}$, $10^{th}$, $11^{th}$, $14^{th}$, $15^{th}$, $18^{th}$, $10^{th}$, $22^{th}$, $23^{th}$, $26^{th}$, $27^{th}$, $30^{th}$, $31^{th}$ data sets;
    the $5^{th}$ calibration bit (cb5)=checksum of a bit string which is formed by a sequential assembly of all the bits of the $4^{th}$, $5^{th}$, $6^{th}$, $7^{th}$, $12^{th}$, $13^{th}$, $14^{th}$, $15^{th}$, $20^{th}$, $21^{th}$, $22^{th}$, $23^{th}$, $28^{th}$, $29^{th}$, $30^{th}$, $31^{th}$, data sets;

the $6^{th}$ calibration bit (cb6)=checksum of a bit string which is formed by a sequential assembly of all the bits of the $8^{th}$, $9^{th}$, $10^{th}$, $11^{th}$, $12^{th}$, $13^{th}$, $14^{th}$, $15^{th}$, $24^{th}$, $25^{th}$, $26^{th}$, $27^{th}$, $28^{th}$, $29^{th}$, $30^{th}$, $31^{th}$, data sets;

the $7^{th}$ calibration bit (cb7)=checksum of a bit string which is formed by a sequential assembly of all the bits of the $16^{th}$, $17^{th}$, $18^{th}$, $19^{th}$, $20^{th}$, $21^{th}$, $22^{th}$, $23^{th}$, $24^{th}$, $25^{th}$, $26^{th}$, $27^{th}$, $28^{th}$, $29^{th}$, $30^{th}$, $31^{th}$, data sets;

the $8^{th}$ calibration bit (cb8)=bit sum of all the bits of the $0^{th}$, $4^{th}$, $8^{th}$, $12^{th}$, $16^{th}$, $20^{th}$, $24^{th}$, $28^{th}$ data sets;

the $9^{th}$ calibration bit (cb9)=bit sum of all the bits of the $1^{th}$, $5^{th}$, $9^{th}$, $13^{th}$, $17^{th}$, $21^{th}$, $25^{th}$, $29^{th}$ data sets;

the $10^{th}$ calibration bit (cb10)=bit sum of all the bits of the $2^{th}$, $6^{th}$, $10^{th}$, $14^{th}$, $18^{th}$, $22^{th}$, $26^{th}$, $30^{th}$ data sets; and the $11^{th}$ calibration bit (cb11)=bit sum of all the bits of the $3^{th}$, $7^{th}$, $11^{th}$, $15^{th}$, $19^{th}$, $23^{th}$, $27^{th}$, $31^{th}$ data sets.

7. The two bit error calibration device for 128 bit transfer as claimed in claim 2, wherein the nine calibration bits are:

the $2^{th}$ calibration bit (cb2)=checksum of a bit string which is formed by a sequential assembly of all the bits of the $1^{th}$, $3^{th}$, $5^{th}$, $7^{th}$, $9^{th}$, $11^{th}$, $13^{th}$, $15^{th}$, $17^{th}$, $19^{th}$, $21^{th}$, $23^{th}$, $25^{th}$, $27^{th}$, $29^{th}$, $31^{th}$ data sets;

the $3^{th}$ calibration bit (cb3)=checksum of a bit string which is formed by a sequential assembly of all the bits of the $2^{th}$, $3^{th}$, $6^{th}$, $7^{th}$, $10^{th}$, $11^{th}$, $14^{th}$, $15^{th}$, $18^{th}$, $19^{th}$, $22^{th}$, $23^{th}$, $26^{th}$, $27^{th}$, $30^{th}$, $31^{th}$ data sets;

the $5^{th}$ calibration bit (cb5)=checksum of a bit string which is formed by a sequential assembly of all the bits of the $4^{th}$, $5^{th}$, $6^{th}$, $7^{th}$, $12^{th}$, $13^{th}$, $14^{th}$, $15^{th}$, $20^{th}$, $21^{th}$, $22^{th}$, $23^{th}$, $28^{th}$, $29^{th}$, $30^{th}$, $31^{th}$, data sets;

the $6^{th}$ calibration bit (cb6)=checksum of a bit string which is formed by a sequential assembly of all the bits of the $8^{th}$, $9^{th}$, $10^{th}$, $11^{th}$, $12^{th}$, $13^{th}$, $14^{th}$, $15^{th}$, $24^{th}$, $25^{th}$, $26^{th}$, $27^{th}$, $28^{th}$, $29^{th}$, $30^{th}$, $31^{th}$, data sets;

the $7^{th}$ calibration bit (cb7)=checksum of a bit string which is formed by a sequential assembly of all the bits of the $16^{th}$, $17^{th}$, $18^{th}$, $19^{th}$, $20^{th}$, $21^{th}$, $22^{th}$, $23^{th}$, $24^{th}$, $25^{th}$, $26^{th}$, $27^{th}$, $28^{th}$, $29^{th}$, $30^{th}$, $31^{th}$, data sets;

the $8^{th}$ calibration bit (cb8)=bit sum of all the bits of the $0^{th}$, $4^{th}$, $8^{th}$, $12^{th}$, $16^{th}$, $20^{th}$, $24^{th}$, $28^{th}$ data sets;

the $9^{th}$ calibration bit (cb9)=bit sum of all the bits of the $1^{th}$, $5^{th}$, $9^{th}$, $13^{th}$, $17^{th}$, $21^{th}$, $25^{th}$, $29^{th}$ data sets;

the $10^{th}$ calibration bit (cb10)=bit sum of all the bits of the $2^{th}$, $6^{th}$ $10^{th}$, $14^{th}$, $18^{th}$, $22^{th}$, $26^{th}$, $30^{th}$ data sets; and the $11^{th}$ calibration bit (cb11)=bit sum of all the bits of the $3^{th}$, $7^{th}$, $11^{th}$, $15^{th}$, $19^{th}$, $23^{th}$, $27^{th}$, $31^{th}$ data sets.

8. A method for two bit error calibration of 128 bit transfer by using the device defined in claim 1, where the method comprises the following steps of:

before storing a data of 128 bits into the 16 memories, the operator dividing the 128 bits of bit into 32 data bit sets with each set having 4 bits; and deriving the calibration bits cb0 to cb15; the dividing data being stored into the 16 memories and the calibration chips;

transferring the data in the 16 memories and the calibration chips to the data bus which receives these data from the 64 receiving ports thereof; 128 bit data being received in two times from the 64 receiving ports;

based on the receiving 128 bit data in the receiving end and originally stored in the 16 memories, the comparator calculating the checksum and bit sums;

if there are two bit errors in the received 128 bit as comparing from the bits stored in the 16 memories, the checksums and bit sums calculated from by the comparator and transferred from the calibration chips will exist differences; and then the data set and the position having two bit errors being detected; then changing the bit from 0 to 1, or from 1 to 0 will correct the bit error.

9. The method as claimed in claim 8, wherein the 16 calibration bits include nine calibration bits for determining two data sets having two error transferred bits.

10. The method as claimed in claim 9, wherein the 16 calibration bits include seven calibration bits for determining two data sets having two error transferred bits, respectively or determining one data set having two error transferred bits.

11. The method as claimed in claim 10, wherein the seven calibration bits are:

the $0^{th}$ calibration bit (cb0)=checksum of a bit string which is formed by a sequential assembly of all the $1^{th}$ bit (b1) and the $3^{th}$ bits of all the data sets;

the $1^{th}$ calibration bit (cb1)=checksum of a bit string which is formed by a sequential assembly of the $2^{th}$ bit (b2) and the $3^{th}$ bits of all the data sets;

the $4^{th}$ calibration bit (cb4)=checksum of a bit string which is formed by a sequential assembly of $0^{th}$ bit (b0) and the $2^{th}$ bit (b2) of the $0^{th}$, $2^{th}$, $4^{th}$, $6^{th}$, $8^{th}$, $10^{th}$, $12^{th}$, $14^{th}$, $16^{th}$, $18^{th}$, $20^{th}$, $22^{th}$, $24^{th}$, $26^{th}$, $28^{th}$, $30^{th}$, data sets;

the $12^{th}$ calibration bit (cb12)=bit sum of all the bits of the data sets;

the $13^{th}$ calibration bit (cb13)=bit sum of all the bits of the data sets;

the $14^{th}$ calibration bit (cb14)=bit sum of all the bits of the data sets; and the $15^{th}$ calibration bit (cb15)=bit sum of all the bits of the data sets.

12. The method as claimed in claim 11, wherein the $0^{th}$ calibration bit (cb0)=checksum of a bit string which is formed by a sequential assembly of all the $1^{th}$ bit (b1) and the $3^{th}$ bits of all the data sets;

the $1^{th}$ calibration bit (cb1)=checksum of a bit string which is formed by a sequential assembly of the $2^{th}$ bit (b2) and the $3^{th}$ bits of all the data sets;

the $4^{th}$ calibration bit (cb4)=checksum of a bit string which is formed by a sequential assembly of $0^{th}$ bit (b0) and the $2^{th}$ bit (b2) of the $0^{th}$, $2^{th}$, $4^{th}$, $6^{th}$, $8^{th}$, $10^{th}$, $12^{th}$, $14^{th}$, $16^{th}$, $18^{th}$, $20^{th}$, $22^{th}$, $24^{th}$, $26^{th}$, $28^{th}$, $30^{th}$ data sets are use to determine that positions of two data sets have the two error bits or positions of one data set have the two error bits.

13. The method as claimed in claim 9, wherein the nine calibration bits are:

the $2^{th}$ calibration bit (cb2)=checksum of a bit string which is formed by a sequential assembly of all the bits of the $1^{th}$, $3^{th}$, $5^{th}$, $7^{th}$, $9^{th}$, $11^{th}$, $13^{th}$, $15^{th}$, $17^{th}$, $19^{th}$, $21^{th}$, $23^{th}$, $25^{th}$, $27^{th}$, $29^{th}$, $31^{th}$ data sets;

the $3^{th}$ calibration bit (cb3)=checksum of a bit string which is formed by a sequential assembly of all the bits of the $2^{th}$, $3^{th}$, $6^{th}$, $7^{th}$, $10^{th}$, $11^{th}$, $14^{th}$, $15^{th}$, $18^{th}$, $19^{th}$, $22^{th}$, $23^{th}$, $26^{th}$, $27^{th}$, $30^{th}$, $31^{th}$ data sets;

the $5^{th}$ calibration bit (cb5)=checksum of a bit string which is formed by a sequential assembly of all the bits of the $4^{th}$, $5^{th}$, $6^{th}$, $7^{th}$, $12^{th}$, $13^{th}$, $14^{th}$, $15^{th}$, $20^{th}$, $21^{th}$, $22^{th}$, $23^{th}$, $28^{th}$, $29^{th}$, $30^{th}$, $31^{th}$, data sets;

the $6^{th}$ calibration bit (cb6)=checksum of a bit string which is formed by a sequential assembly of all the bits of the $8^{th}$, $9^{th}$, $10^{th}$, $11^{th}$, $12^{th}$, $13^{th}$, $14^{th}$, $15^{th}$, $24^{th}$, $25^{th}$, $26^{th}$, $27^{th}$, $28^{th}$, $29^{th}$, $30^{th}$, $31^{th}$, data sets;

the $7^{th}$ calibration bit (cb7)=checksum of a bit string which is formed by a sequential assembly of all the bits of the $16^{th}$, $17^{th}$, $18^{th}$, $19^{th}$, $20^{th}$, $21^{th}$, $22^{th}$, $23^{th}$, $24^{th}$, $25^{th}$, $26^{th}$, $27^{th}$, $28^{th}$, $29^{th}$, $30^{th}$, $31^{th}$ data sets;

the $8^{th}$ calibration bit (cb8)=bit sum of all the bits of the $0^{th}$, $4^{th}$, $8^{th}$, $12^{th}$, $16^{th}$, $20^{th}$, $24^{th}$, $28^{th}$ data sets;

the $9^{th}$ calibration bit (cb9=bit sum of all the bits of the $1^{th}$, $5^{th}$, $9^{th}$, $13^{th}$, $17^{th}$, $21^{th}$, $25^{th}$, $29^{th}$ data sets;

the $10^{th}$ calibration bit (cb10)=bit sum of all the bits of the $2^{th}$, $6^{th}$, $10^{th}$, $14^{th}$, $18^{th}$, $22^{th}$, $26^{th}$, $30^{th}$ data sets; and the $11^{th}$ calibration bit (cb11)=bit sum of all the bits of the $3^{th}$, $7^{th}$, $11^{th}$, $15^{th}$, $19^{th}$, $23^{th}$, $27^{th}$, $31^{th}$ data sets.

14. The method as claimed in claim 9, wherein the nine calibration bits are:

the $2^{th}$ calibration bit (cb2)=checksum of a bit string which is formed by a sequential assembly of all the bits of the $1^{th}$, $3^{th}$, $5^{th}$, $7^{th}$, $9^{th}$, $11^{th}$, $13^{th}$, $15^{th}$, $17^{th}$, $19^{th}$, $2^{th}$, $23^{th}$, $25^{th}$, $27^{th}$, $29^{th}$, $31^{th}$ data sets;

the $3^{th}$ calibration bit (cb3)=checksum of a bit string which is formed by a sequential assembly of all the bits of the $2^{th}$, $3^{th}$, $6^{th}$, $7^{th}$, $10^{th}$, $11^{th}$, $14^{th}$, $15^{th}$, $18^{th}$, $19^{th}$, $22^{th}$, $23^{th}$, $26^{th}$, $27^{th}$, $30^{th}$, $31^{th}$ data sets;

the $5^{th}$ calibration bit (cb5)=checksum of a bit string which is formed by a sequential assembly of all the bits of the $4^{th}$, $5^{th}$, $6^{th}$, $7^{th}$, $12^{th}$, $13^{th}$, $14^{th}$, $15^{th}$, $20^{th}$, $21^{th}$, $22^{th}$, $23^{th}$, $28^{th}$, $29^{th}$, $30^{th}$, $31^{th}$, data sets;

the $6^{th}$ calibration bit (cb6)=checksum of a bit string which is formed by a sequential assembly of all the bits of the $8^{th}$, $9^{th}$, $10^{th}$, $11^{th}$, $12^{th}$, $13^{th}$, $14^{th}$, $15^{th}$, $24^{th}$, $25^{th}$, $26^{th}$, $27^{th}$, $28^{th}$, $29^{th}$, $30^{th}$, $31^{th}$ data sets;

the $7^{th}$ calibration bit (cb7)=checksum of a bit string which is formed by a sequential assembly of all the bits of the $16^{th}$, $17^{th}$, $18^{th}$, $19^{th}$, $20^{th}$, $21^{th}$, $22^{th}$, $23^{th}$, $24^{th}$, $25^{th}$, $26^{th}$, $27^{th}$, $28^{th}$, $29^{th}$, $30^{th}$, $31^{th}$ data sets;

the $8^{th}$ calibration bit (cb8)=bit sum of all the bits of the $0^{th}$, $4^{th}$, $8^{th}$ $12^{th}$, $16^{th}$, $20^{th}$, $24^{th}$, $28^{th}$ data sets;

the $9^{th}$ calibration bit (cb9)=bit sum of all the bits of the $1^{th}$, $5^{th}$, $9^{th}$, $13^{th}$, $17^{th}$, $21^{th}$, $25^{th}$, $29^{th}$ data sets;

the $10^{th}$ calibration bit (cb10)=bit sum of all the bits of the $2^{th}$, $6^{th}$, $10^{th}$, $14^{th}$, $18^{th}$, $22^{th}$, $26^{th}$, $30^{th}$ data sets; and the $11^{th}$ calibration bit (cb11)=bit sum of all the bits of the $3^{th}$, $7^{th}$, $11^{th}$, $15^{th}$, $19^{th}$, $23^{th}$, $27^{th}$, $31^{th}$ data sets.

15. The method as claimed in claim 8, wherein after correction, a new set of 128 bits is derived, the comparator calculating calibration bits (cb0) to (cb15) as described above for the corrected new 128 bits; the results is compared with the calibration bits (cb0) to (cb15) originally stored in the calibration chips; if all the calibration bits are identical, it means that the corrections are correct; if some calibration bits are different, it means that the numbers of the error bits in transfer are greater than 2.

\* \* \* \* \*